US006906526B2

(12) United States Patent
Hart, Jr. et al.

(10) Patent No.: US 6,906,526 B2
(45) Date of Patent: Jun. 14, 2005

(54) NON-INTRUSIVE CABLE CONNECTION MONITORING FOR USE IN HFC NETWORKS

(75) Inventors: William C. Hart, Jr., Huntley, IL (US); David J. Smentek, Addison, IL (US); John L. Moran, III, Millville, MA (US)

(73) Assignee: General Instrument Corporation, Horsham, PA (US)

( * ) Notice: Subject to any disclaimer, the term of this patent is extended or adjusted under 35 U.S.C. 154(b) by 73 days.

(21) Appl. No.: 10/389,496

(22) Filed: Mar. 14, 2003

(65) Prior Publication Data

US 2004/0178801 A1 Sep. 16, 2004

(51) Int. Cl.[7] ............... G01R 31/08; H04B 3/46; H04Q 1/20
(52) U.S. Cl. ............ 324/527; 324/539; 375/224
(58) Field of Search ................. 324/527, 525, 324/512, 508, 520, 66, 539–540; 379/14.01, 15.01, 1.03; 340/859.4; 370/242–245; 455/403; 714/25, 45, 47; 375/224, 219; 725/111, 105, 109

(56) References Cited

U.S. PATENT DOCUMENTS

| | | | | |
|---|---|---|---|---|
| 3,986,106 A | * | 10/1976 | Shuck et al. ............ | 324/540 |
| 5,414,343 A | * | 5/1995 | Flaherty et al. .......... | 324/66 |
| 5,473,599 A | * | 12/1995 | Li et al. ................ | 370/219 |
| 5,493,650 A | | 2/1996 | Reinke et al. ......... | 395/200.12 |
| 5,844,411 A | * | 12/1998 | Vogt .................. | 324/537 |
| 5,977,773 A | | 11/1999 | Medelius et al. ....... | 324/520 |
| 5,990,687 A | | 11/1999 | Williams ............. | 324/529 |
| 6,400,934 B1 | * | 6/2002 | Calixte .............. | 455/217 |
| 6,594,305 B1 | * | 7/2003 | Roeck et al. .......... | 375/222 |
| 2002/0129379 A1 | | 9/2002 | Lawson | |

OTHER PUBLICATIONS

Cahners Publishing, "CMTS Testing Keeps the Data Flowing" Test and Measurement World; vol. 20, No. 11, Sep. 1, 2000, pp. 47–48, 50, 52, 5, XP001005767; ISSN: 0744–1657; p. 47, middle column, para. 2; p. 47, right–hand column, para. 2; p. 48, middle column, para 1; p. 50, left–hand column, para 1; figure 1.

* cited by examiner

*Primary Examiner*—N. Le
*Assistant Examiner*—Jeff Natalini
(74) *Attorney, Agent, or Firm*—Volpe and Koenig, P.C.

(57) ABSTRACT

A method and an apparatus are employed for individually monitoring the connectivity status of cables connected at a cable modem termination system (CMTS), where the cables conduct upstream and downstream RF communication signals. The monitoring is self-contained within the CMTS. The monitoring is achieved by producing a reference signal having a frequency outside the frequency range of the RF communication signals. The reference signal is injected onto the RF communication signal. The power level of the reference signal is detected within the CMTS, whereby the power level correlates with an expected cable load impedance. A DC control voltage based on the detected power level of the reference signal is generated, which allows a controller to determine the connectivity statuses of the connected cables.

13 Claims, 3 Drawing Sheets

NON-INTRUSIVE CABLE CONNECTION MONITORING FOR USE IN HFC NETWORKS

FIELD OF THE INVENTION

The present invention generally relates to switching of upstream and downstream RF communications among redundant primary and backup routers in HFC access networks, and more particularly, to cable connection monitoring at the routers.

BACKGROUND

In an IP or VoIP network using cable routers and hybrid fiber coaxial (HFC) access networks, a cable interface such as a cable modem termination system (CMTS) is necessary. FIG. 1 shows a diagram of communication system 10, comprising the IP network 70, system headend 75, including primary routers 21, backup router 22 and cable modem termination system (CMTS) 20; HFC access network 40, PSTN 15 and end users 25, 26. Detection and status reporting of CMTS cable connections can prevent a switchover from a primary router 21 to a backup or redundant router 22 from occurring under network failures caused by external cable problems, such as improper connection, removed cable connection to one or more of its RF ports, cable break, etc. Switching to backup equipment during external faults does not solve the problem, and effectively ties up both the primary and backup equipment needlessly. This reduces the overall reliability of the system. It is also desirable to have the ability to quickly detect and locate a fault in the HFC cable network to allow prompt repair and system recovery.

Prior art solutions include injection of a signal across the center conductor or coaxial shield at the source of a cable connection. The presence of the known signal is then detected by either a dedicated detector placed at one or more points along the signal path or through detection of the radiated signal through some type of inductive coupling. Connection of specific continuity detectors to cable or near the cable in the HFC network is a not viable option where a CMTS designer has little control over the externally coupled cable network. In addition, even in cable plants where it would be possible to connect external cable monitoring equipment, the CMTS's need for such equipment and its maintenance may be unfavorable to network managers.

An alternative solution is time domain reflectometry (TDR) which can sense cable discontinuities when the cable length is great enough. However, implementing TDR in the CMTS or matrix switch is prohibitive with respect to cost, size and complexity. TDR is also an intrusive test and is ineffective on short cable lengths.

SUMMARY

A continuously operating non-intrusive, self-contained system of determining cable connectivity between a cable modem termination system (CMTS) and the remainder of the HFC cable plant is employed. A reference signal having an out-of-band power signal is placed onto the cable network for detection by an onboard power detector. A correctly terminated cable produces a power measurement that correlates with an expected cable load impedance. The power detector generates a DC voltage proportional to the power level applied to its input. A comparator verifies that the voltage falls within the expected range. A detector reading that is outside the range of normal connectivity indicates a fault condition.

DESCRIPTION OF THE PREFERRED EMBODIMENTS

Figure 1:
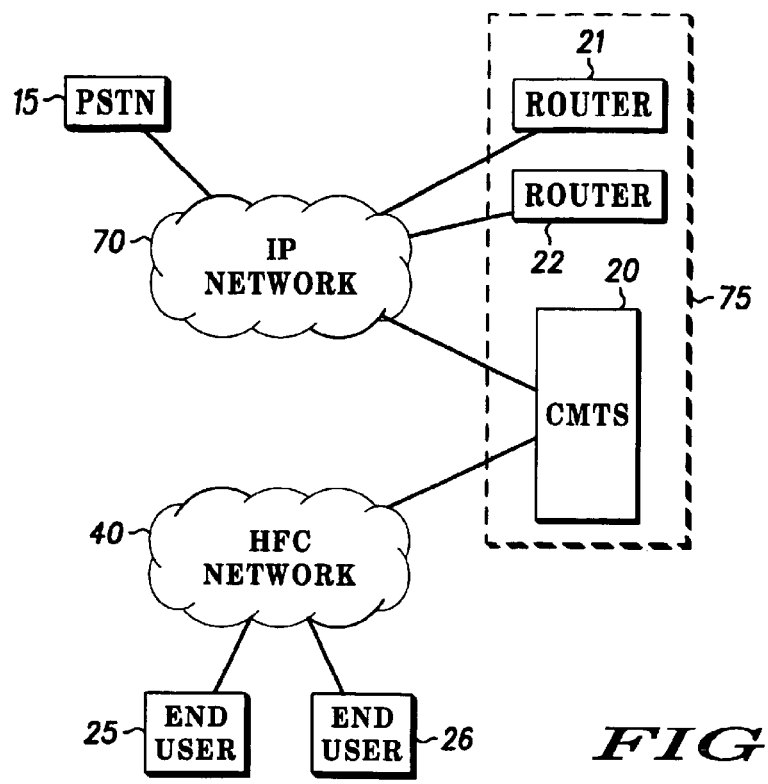
FIG. 1 shows a block diagram of an HFC access network.
Figure 2:
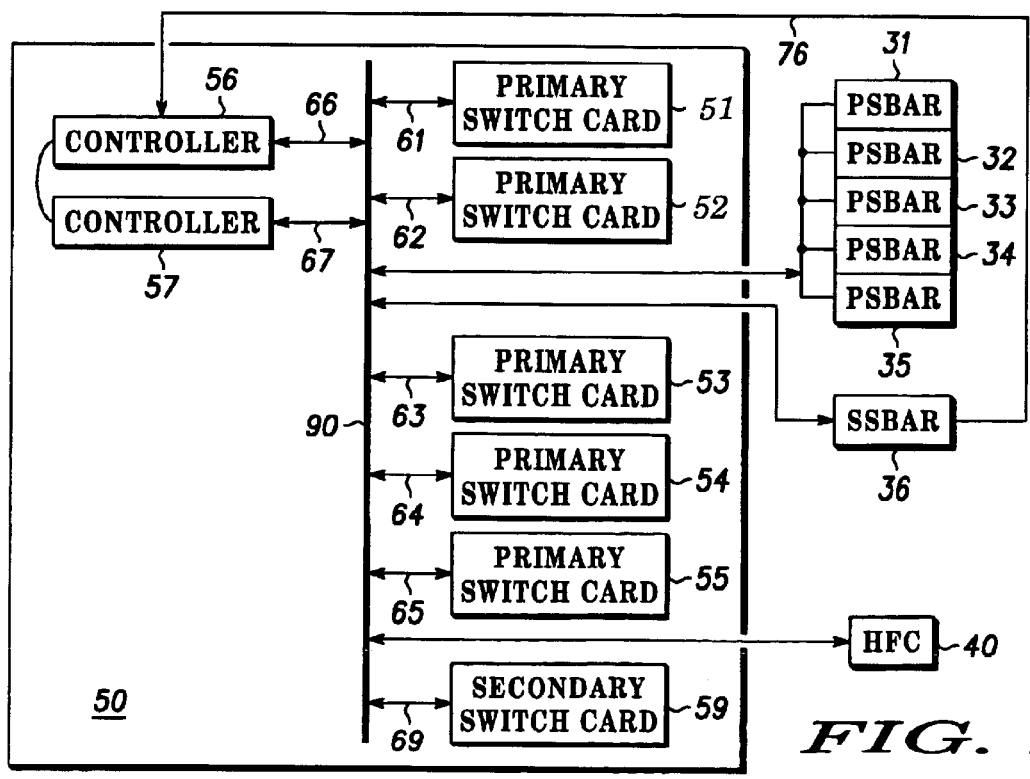
FIG. 2 shows a block diagram of an RF switch used in a cable modem termination system.

FIG. 2 shows a block diagram of an RF switch 50, used within a CMTS as an interface between primary stackable broadband access routers (PSBARs) 31–35, secondary stackable broadband access router (SSBAR) 36, and HFC access network 40. Each PSBAR 31–35 and SSBAR 36 preferably comprises one transmitter Tx and eight receivers Rx0–Rx7 (not shown).

RF switch 50 provides the switching capability to allow the SSBAR 36 to function as a PSBAR, when it has been determined that any of the PSBARs 31–35 have malfunctioned. The RF switch 50 provides the inter-connect between PSBARs 31–35, SSBAR 36, and the HFC network 40 residing at the cable operator's distribution hub or headend operation.

RF switch 50 comprises an RF backplane 90 connected to various modules: RF switch controller card 56; an optional backup RF switch controller card 57; preferably five primary switch cards 51–55; and one secondary switch card 59. Although RF switch 50 is described comprising a particular number of switch cards and switch controller cards, the number of cards is preferable, but not intended to be limiting. Alternative embodiments include, but are no limited to, more or less primary switch cards, secondary switch cards and switch controller cards as deemed necessary for interface with any number of PSBARs and SSBARs.

RF switch controllers 56, 57 provide a communications link between SSBAR 36 and RF Switch 50. Including a second RF switch controller 57 in addition to controller 56 enables the RF switch hardware to meet the "five nines" (99.999%) high availability (HA) standard. The redundancy of two switch controllers 56, 57 also serves a benefit of allowing either controller card to serve as the master controller. The SSBAR 36 monitors a first controller, say 56, to ensure it is operating properly. If the SSBAR 36 detects an error with controller 56, it will send commands to controller 57. If the first controller card fails, the second controller can be used to manipulate and monitor RF switch 50.

Each primary switch card 51–55 is connected to one of the PSBARs 31–35, respectively. The purpose of the primary switch cards 51–55 is to provide interconnect and switching capability between the RF circuitry of PSBARs 31–35 and SSBAR 36. A primary switch card 51–55 is used in conjunction with the secondary switch card 59 to provide the complete switchover between a malfunctioning PSBAR 31–35 and the SSBAR 36. The primary function is to switch the malfunctioning PSBAR's RF transmitter and receiver connections to the SSBAR's RF transmitter and receivers. RF switch controller 56, 57 programs the primary switch cards 51–55 via connections 61–67 with RF backplane 90. Relays are used to switch between ports on the primary switch cards 51–55 upon control commands dispatched by switch controllers 56, 57. Connections 61–67 include serial peripheral interfaces (SPIs) as well as parallel cables that carry signals from transmitters Tx and receivers Rx0–Rx7 of PSBAR 31–35 and SSBAR 36. There is cable detection circuitry on each of the primary switch cards 51–55 to detect proper cable connectivity to its corresponding activated PSBAR 31–35 or SSBAR 36, as will be discussed in further detail.

Secondary switch card 59 is used to route signals between SSBAR 36 to each primary switch card 51–55.

RF switch controllers 56, 57 store settings for primary switch cards 51–55 and secondary switch card 59. Deciphered messages containing switch setting information is interpreted by RF switch controller 56 or 57 and relayed to the switch cards via the SPI connections. Polling by SSBAR 36 determines the current state of all status information on RF switch controllers 56, 57.

Figure 3:
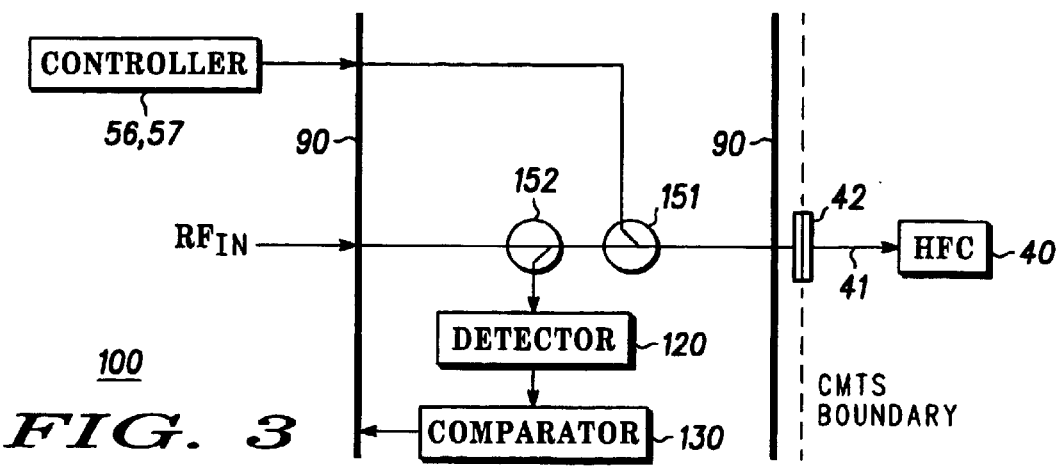
FIG. 3 shows a block diagram of a cable connection monitoring circuit for a downstream communication path from an RF switch to an HFC network.

FIG. 3 shows an interconnection diagram of cable connection monitoring circuit 100 for a single primary switch card representative of primary switch cards 51–55. Each primary switch card 51–55 has circuitry for continuously performing self-contained detection of the connectivity of cables attached to HFC network 40. Monitoring circuit 100 determines if a monitored cable has been removed, cut in the immediate vicinity, or short circuited, which permits an appropriate decision for primary and secondary resources of the CMTS that maintains best availability. Any cable fault condition detected by circuit 100 indicates that a switch from the PSBAR 31–35 to the SSBAR 36 is unnecessary. Switch controllers 56, 57 supply a sinusoidal control signal of preferably 4.8 MHz used in the cable detection circuitry of the primary switch cards 51–55. A frequency of 4.8 MHz is preferable because it is non-intrusively below the standard upstream frequency range (5–60 MHz), but with close enough proximity to ensure an impedance close to the network nominal impedance, typically 75 Ohms. As a non-intrusive signal, the injection of the 4.8 MHz signal out onto the cable does not impair, interrupt, or otherwise reduce the available/usable spectrum available for any programming or other services that may be carried on that cable. Each controller 56, 57 drives this signal on a separate line for each primary switch card 51–55 and monitors the 4.8 MHz signal to ensure it is operating properly.

For cable connection monitoring on the HFC network 40 downstream signal cable 41 connection to the CMTS at connector 42, the 4.8 MHz signal is injected onto the main RF signal path via directional coupler 151. Preferably, coupler 151 has a soldered connection onto a trace of the primary switch card 51–55, which maintains the nominal impedance rating of the RF signal path, (i.e., preferably 75 Ohms). The RF signal $RF_{IN}$ originates from either PSBAR 31–35 or SSBAR 36 transmitter Tx connected to RF switch 50 in the CMTS. Power detector 120 and window comparator 130 test for the presence of the nominal network impedance. Power detector 120 receives the reference signal from the backplane 90 through directional coupler 152, an equivalent counterpart to coupler 151. The received 4.8 MHz reference signal is converted by power detector 120, which generates a DC voltage proportional to the power level of the received reference signal. A predefined window of acceptable readings is stored by window comparator 130 for comparison to the measured values. Window comparator 130 verifies whether the measured voltage is within the expected range. A detector reading that is outside the window of normal connectivity indicates a fault or open cable condition. A disconnected or open cable will produce a higher than normal power reading due to the high impedance as seen at connector 42. A connected cable with a short circuit or ground fault condition will produce a lower than normal power reading as there is a low impedance condition on the cable. Accordingly, comparator 130 sends a cable status indicator signal to backplane 90. The status indicator is an alarm signal for either of the two possible types of detected cable fault conditions. Otherwise, the status indicator is an acknowledgement signal that the cable connectivity is satisfactory. Controller 56, 57 receives the status indicator signal and thereby maintains the continuous cable connectivity monitoring status for cable 41. Similar connectivity status is maintained for the cables associated with each primary switch card 51–55.

Figure 4:
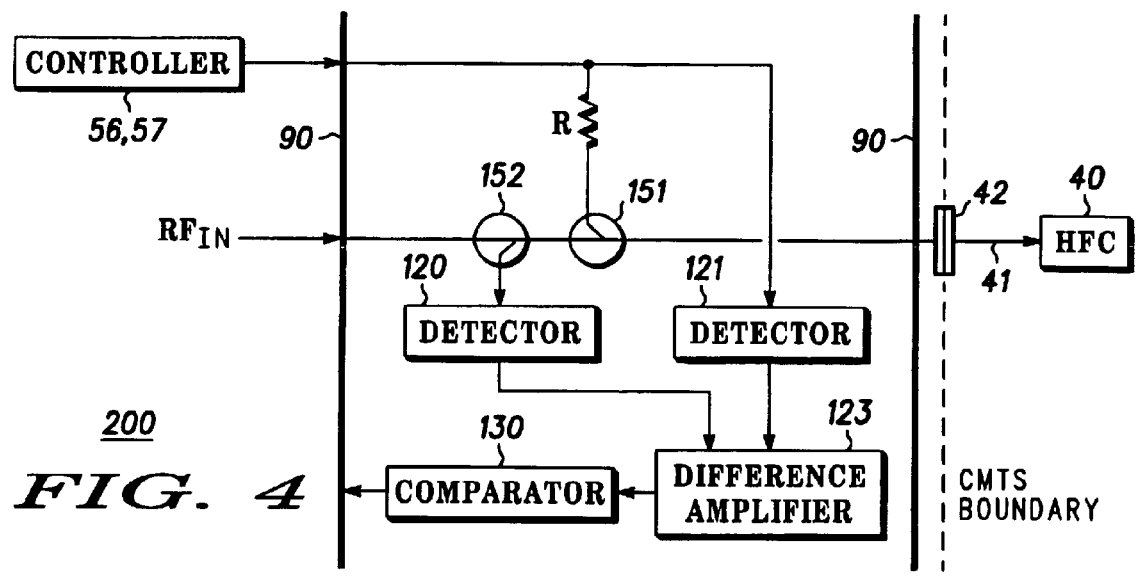
FIG. 4 shows a block diagram of an alternative embodiment to the cable connection monitoring circuit of FIG. 3.

FIG. 4 shows an alternative embodiment 200 in which power detector 120 measures differential power across a series source resistor R that is connected between the 4.8 MHz signal source and directional coupler 151 at the RF signal path. Parallel power detector 121 acts as a reference signal monitor as it directly measures the 4.8 MHz reference signal power. Difference amplifier 123 determines the differential power between power detectors 120 and 121. Window comparator 130 compares the measured power difference value to a stored range of predetermined acceptable power values. A detection of differential power that is within a predetermined window for normal differential power indicates normal connectivity. However, detection of a less than normal power differential indicates a high impedance, which is caused by either a broken or disconnected cable 41. If a significant power drop, or power differential, is detected between the reference source power measured by detector 121 and the power present at RF signal cable measured by detector 120, it indicates a possible short or ground fault condition. The advantage of this embodiment compared with that shown in FIG. 3 is that output power for the 4.8 MHz reference signal does not need to be as tightly controlled because it is not directly used as the reference for comparison. Thus, fluctuations in the 4.8 MHz signal are less troublesome.

Figure 5:
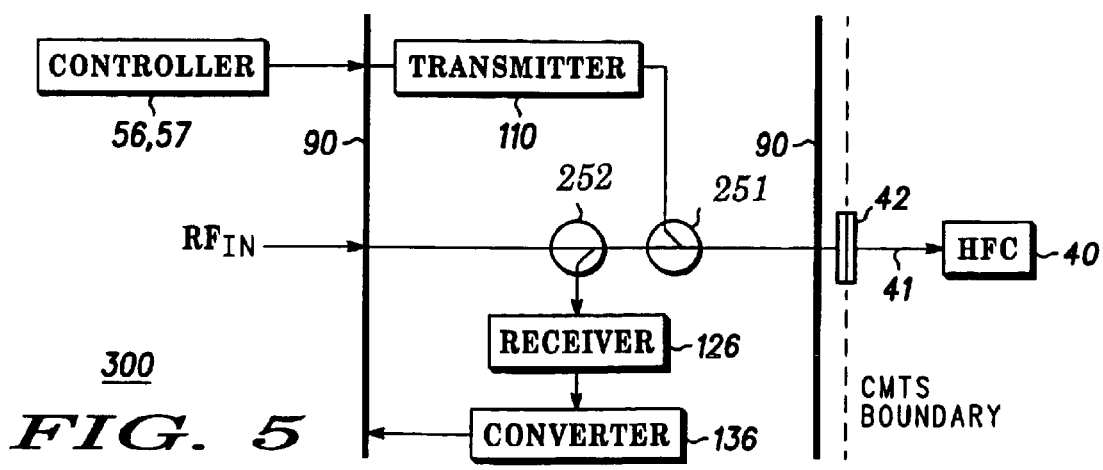
FIG. 5 shows a block diagram of an alternative embodiment to the cable connection monitoring circuit of FIG. 4.

FIG. 5 shows an alternative embodiment in circuit 300 which uses a transmitter 110 to produce a 3 kHz output signal from the reference 4.8 MHz signal. Preferably, transmitter 110 comprises an IC modem having significantly higher impedance than the nominal 75 Ohm system impedance. The preferred embodiment includes a 600 Ohms rated modem, but modems having other rated impedance values may be used. The advantage of the higher impedance is to eliminate the need for high isolation directional couplers 151 and 152, which introduce insertion loss. Instead, the 3 kHz signal is injected onto the main RF signal path via non-directional coupler 251 on the primary switch card 51–55. Receiver 126, which may also comprise a modem IC, receives the 3 kHz reference signal through non-directional coupler 252. When an HFC cable 41 is disconnected at CMTS connector 42, the level of the 3 kHz signal drops below the carrier detect threshold level of the receiver 126. The output of receiver 126 is converted to an SPI compatible signal at converter 136, which signals controller 56, 57 via backplane 90 that a cable has been disconnected. Depending on how receiver 126 is implemented, detector 136 may be unnecessary, or it can be a digital level translator, or a digital SPI interface. For example, receiver 126 may be implemented to produce simply either a digital true or false signal that can be easily read by controller 56, 57 to mean either connectivity is good, or there is a cable fault. In such a case, detector 136 is not needed. Similar to detector 120 in circuits 100 and 200, detector 126 of circuit 300 monitors the reference signal for high impedance faults, short circuit and ground faults on cable 41.

Figure 6:
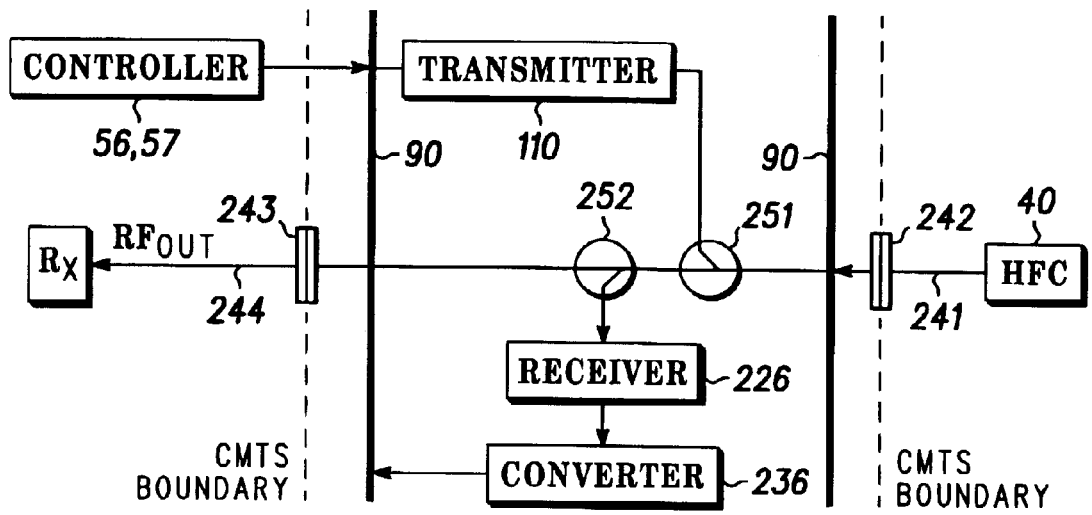
FIG. 6 shows a block diagram of a cable connection monitoring circuit for an upstream communication path from an HFC network to an RF switch and from an RF switch to a router receiver.

FIG. 6 shows a block diagram of the HFC cable connection monitoring circuitry 400 for an upstream signal cable 241 at connector 242 to one receiver Rx from among eight receivers Rx0–Rx7 in each PSBAR 31–35 and SSBAR 36. Transmitter 110 produces a 3 kHz output signal from the reference 4.8 MHz reference signal. The 3 kHz signal is transmitted across the monitored RF signal path via non-directional coupler 251 on the primary switch card 51–55. Receiver 226, which may also comprise a modem IC, receives the 3 kHz reference signal through non-directional coupler 252. When an RF port's upstream HFC cable 241 is disconnected at CMTS connector 242, the level of the 3 kHz signal drops below the carrier detect threshold level of the receiver 226. The output of receiver 226 is converted to an SPI compatible signal at converter 236, which signals controller 56, 57 via backplane 90 that a cable has been disconnected.

The cable connectivity monitoring circuitry 400 shown in FIG. 6 also includes continuity detection for an upstream signal cable on the PSBAR 31–35 and SSBAR 36 receiver side. A 4.8 MHz sine wave is driven down the RF backplane 90 of a primary switch card 51–55 to connector 243, to which a cable between one of PSBARs 31–35 or SSBAR 36 and the RF switch 50 are attached. Cable 244 represents a single cable connected to one receiver Rx from among eight receivers Rx0–Rx7 of PSBARs 31–35 and SSBAR 36. Each PSBAR 31–35 and SSBAR 36 have their respective detectors that monitor presence of this 4.8 MHz signal and notify RF switch controller 56, 57 through SPI connections with backplane 90. The RF switch controller 56, 57 and SSBAR 36 maintain continuous communication to facilitate seamless switchover from primary to secondary operation or vice-versa. All cable detection status, regardless of whether detection is at PSBAR 31–35, SSBAR 36 or RF switch 50, is communicated to the common control point at RF switch controller 56, 57.

Figure 7:
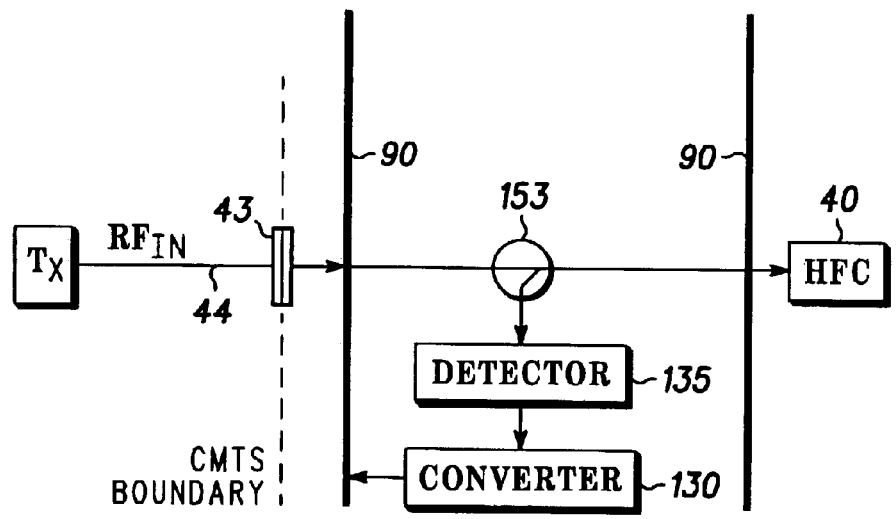
FIG. 7 shows a block diagram of a cable connection monitoring circuit for downstream cables from a router transmitter to an RF switch.

FIG. 7 shows a block diagram of cable connection monitoring circuitry 500 for the downstream cable connections from a PSBAR 31–35 or SSBAR 36 transmitter onto the RF switch 50. An RF signal detector 135 checks for presence of RF signal power in the downstream frequency band extracted from the RF signal path at directional coupler 152. If there is presence of an RF signal, it follows that there must be a cable connected from the router transmitter Tx to the RF switch 50 of the CMTS. Converter 130 reads the RF signal indication signal from detector 135, and provides indication of cable connectivity to switch controller 56, 57 through backplane 90. A power detector at Tx output concurrently monitors cable 44 power on the SBAR side of cable 44 so the status is known on both ends of the cable 44.

What is claimed is:

1. A method for individually monitoring the connectivity status of a plurality cables, each cable connected at a respective port on a cable modem termination system (CMTS) having switching interfaces between primary and secondary routers, the cables conducting upstream and downstream RF communication signals on parallel paths having a nominal system impedance, whereby the monitoring is self-contained within the CMTS, comprising the steps:

a) producing a sinusoidal reference signal having a frequency outside the frequency range of the RF communication signals;
   b) injecting the reference signal onto the parallel RF communication signal paths;
   c) individually detecting on each path, the power level of the reference signal, whereby the power level correlates with an expected cable load impedance and the detecting occurs within the CMTS boundary;
   d) producing a DC control voltage for each path based on the detected power level of the reference signal on each path;
   e) determining the connectivity statuses of the connected cables based on the DC voltages of step d); and
   f) generating a cable status indicator for each RF port cable.

2. The method of claim 1 whereby the determining step of step e) is based on whether the resultant value of step d) is within a predetermined range of values associated with normal cable connectivity.

3. The method of claim 2 whereby a detected reference signal power level below the expected range in step d) produces a cable status indicator of a cable fault in step f).

4. The method of claim 2 whereby a detected reference signal power level above the expected range in step d) produces a cable status indicator of an open or disconnected cable in step f).

5. The method of claim 1 whereby the reference signal injected onto the RF signal path is produced by a modem transmitter having an impedance greater than the nominal system impedance and the detecting of step c) is performed by a modem receiver having an impedance greater than the nominal system impedance.

6. A method for individually monitoring the connectivity status of a plurality cables, each cable connected at a respective port on a cable modem termination system (CMTS) having switching interfaces between primary and secondary routers, the cables conducting upstream and downstream RF communication signals on parallel paths having a nominal system impedance, comprising the steps:

a) producing a sinusoidal reference signal having a frequency outside the frequency range of the RF communication signals;
   b) injecting the reference signal onto the parallel RF communication signal paths;
   c) individually detecting on each path, the reference signal power level whereby the detecting occurs within CMTS boundary;
   d) comparing the power level of the detected reference signal to the power level of the injected reference signal to produce a resultant difference value;
   e) determining the connectivity status of the connected cables based on the difference value of step d); and
   f) generating a cable status indicator for each RF port cable.

7. An apparatus having a plurality of parallel cable connectivity monitoring circuits, for detecting the status of a plurality cables, each cable at a cable modem termination system (CMTS) having switching interfaces between primary and secondary routers, the cables conducting upstream and downstream RF communication signals on parallel paths having a nominal system impedance, each parallel circuit comprising:

an RF backplane for carrying the communication signals and a reference signal with a frequency outside the frequency range of the communication signals;

at least one RF port for connecting at least one cable to a monitored RF signal path of the CMTS;

a sinusoidal signal generator coupled to the RF backplane for producing the reference signal for injection onto a monitored RF signal path;

a power detector coupled to the RF backplane for detecting the injected reference signal power level within the CMTS boundary, and for sending a cable connectivity status indicator signal to the RF backplane based on the detected reference signal power level; and a controller for monitoring the reference signal and the status indicator signals and controlling switching of primary and secondary routers of the CMTS accordingly.

8. The apparatus of claim 7 wherein the power detector further comprises:

a converter for producing a DC control voltage corresponding to the detected power level of the reference signal; and a window comparator for verifying whether the DC control voltage from the converter is within a range of acceptable values stored by the comparator.

9. The apparatus of claim 7 wherein each circuit further comprises:

a resistor coupled between the sinusoidal generator and the monitored RF signal path; and a reference signal monitor coupled in parallel with the detector for directly measuring the reference signal;

a difference amplifier coupled to the power detector and reference signal monitor for determining the differential power between the monitor and detector.

10. The apparatus of claim 7 wherein the sinusoidal generator is a transmitter modem with an impedance greater than the nominal system impedance; and the power detector is a receiver modem with an impedance greater than the nominal system impedance.

11. The apparatus of claim 10 whereby the power detector detects connectivity of cables used for upstream signals.

12. The apparatus of claim 7 further comprising:

an RF signal detector coupled to the monitored RF signal path that detects RF signal power in a frequency band associated with downstream signals, for monitoring connectivity of cable coupled between a router and the CMTS.

13. A non-intrusive cable connection monitoring apparatus having a plurality of parallel detection circuits for detecting the status of a plurality cables, each cable connected at a respective port on a cable modem termination system (CMTS), the CMTS used for switching interface between primary and secondary routers, where the routers send RF communication signals delivered to a hybrid fiber coaxial (HFC) cable network connected to the CMTS, and the CMTS conducts both upstream and downstream communication signals on parallel paths having a nominal system impedance, each parallel circuit comprising:

an RF backplane for carrying the communication signals and a reference signal with a frequency outside the frequency range of the communication signals;

a plurality of HFC ports for connecting at least one cable between the HFC network and the CMTS via the RF backplane;

a plurality of router ports for connecting at least one cable between the primary and secondary routers via the RF backplane;

a sinusoidal signal generator coupled to the RF backplane for producing the reference signal for injection onto a monitored RF signal path;

a power detector coupled to the RF backplane for detecting the injected reference signal power level within the CMTS boundary, and for sending a first connectivity status indicator signal pertaining to downstream communication cable to the RF backplane based on the detected reference signal power level;

a transmitter modem with an impedance greater than the nominal system impedance for converting the reference signal and injecting the converted reference signal onto the signal path;

a receiver modem with an impedance greater than the nominal system impedance coupled to the communication path for detecting the converted reference signal and sending a second connectivity status indicator signal pertaining to upstream communication signals; and a controller for monitoring the reference signal and the status indicator signals and controlling switching of primary and secondary routers of the CMTS accordingly.

* * * * *